United States Patent
Tregub et al.

(10) Patent No.: US 7,763,395 B2
(45) Date of Patent: Jul. 27, 2010

(54) RADIATION STABILITY OF POLYMER PELLICLES

(75) Inventors: Alexander (Alex) Tregub, Oak Park, CA (US); Florence Eschbach, Portola Valley, CA (US); James Powers, Aloha, OR (US); Fu-Chang Lo, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 1280 days.

(21) Appl. No.: 10/611,070

(22) Filed: Jun. 30, 2003

(65) Prior Publication Data

US 2006/0234134 A1    Oct. 19, 2006

(51) Int. Cl.
*G03F 1/00* (2006.01)
*G03B 27/42* (2006.01)
(52) U.S. Cl. .............................. 430/5; 355/53
(58) Field of Classification Search ...................... 430/5; 428/14; 355/53, 72
See application file for complete search history.

(56) References Cited

U.S. PATENT DOCUMENTS

| | | | | |
|---|---|---|---|---|
| 5,772,817 | A * | 6/1998 | Yen et al. ................. | 156/73.1 |
| 6,614,504 | B2 * | 9/2003 | Aoki et al. ................ | 355/30 |
| 6,803,996 | B2 * | 10/2004 | Kamono .................... | 355/75 |
| 6,833,903 | B2 * | 12/2004 | Kamono .................... | 355/30 |
| 2001/0006418 | A1 * | 7/2001 | Dao et al. ................. | 356/337 |
| 2002/0085183 | A1 * | 7/2002 | Wu et al. .................. | 355/30 |
| 2004/0009425 | A1 * | 1/2004 | French et al. ............. | 430/270.1 |
| 2004/0137371 | A1 * | 7/2004 | Garza et al. .............. | 430/311 |

OTHER PUBLICATIONS

Solid State Technology, 34, ISSN: 0038-111X; vol. 45, issue 7, Jul. 2002.
Florence Eschbach, et al., Development of Polymer Membranes for 157 nm Lithography, Proceedings of SPIE, vol. 5377, pp. 1627-1640, 2004.
John Brydson, "Plastic Materials", Seventh Edition, Butterworth Heinemannam, 1999. Chapters 9, 13, 14.
John Scheirs (editor), Modern Fluoropolymers, John Wiley & Sons, 2002. Chapter 22.

* cited by examiner

*Primary Examiner*—Stephen Rosasco
(74) *Attorney, Agent, or Firm*—Blakely, Sokoloff, Taylor & Zafman LLP

(57) ABSTRACT

An embodiment of the present invention includes a technique to improve stability of a pellicle. The pellicle is pre-baked at a predetermined temperature substantially below a glass transition temperature. The pre-baked pellicle is purged with an inert gas. The purged pellicle is radiated by a radiation at a wavelength. In another embodiment, a chamber is sealed with a pellicle membrane which divides the chamber into first and second compartments. The chamber has an inflow opening in the first compartment and an outflow opening in the second compartment. A gas is injected into the inflow opening and penetrates the pellicle membrane to the outflow opening. In another embodiment, the chamber has first inflow and outflow openings and second inflow and outflow openings in the first and second compartments, respectively. A first gas is injected into the first inflow opening and a second gas into the second inflow opening. The first and second gases have a permeability difference. The first gas penetrates the pellicle membrane to the second outflow opening.

18 Claims, 9 Drawing Sheets

RADIATION STABILITY OF POLYMER PELLICLES

BACKGROUND

1. Field of the Invention

Embodiments of the invention relates to the field of semiconductor, and more specifically, to lithography.

2. Description of Related Art

Advances in lithography have opened many opportunities in semiconductor technology and at the same time presented many challenges. The introduction of wavelengths below 193 nm has created a need for new pellicle development efforts. A pellicle is a thin membrane or plate placed between the photo-mask and the projection optics or wafer plane. The pellicle ensures the image quality of the pattern projected on the wafer by protecting the photo-mask from contamination.

Currently, existing pellicles degrade rapidly and become opaque to the transmitted light when subject to the higher energy irradiation at the wavelength of 157 nm. In addition to transparency loss, existing pellicles suffer mechanical integrity, stability, and durability.

BRIEF DESCRIPTION OF THE DRAWINGS

The invention may best be understood by referring to the following description and accompanying drawings that are used to illustrate embodiments of the invention. In the drawings.

DESCRIPTION

An embodiment of the present invention includes a technique to improve stability of a pellicle. The pellicle is pre-baked at a predetermined temperature substantially below a glass transition temperature. The pre-baked pellicle is purged with an inert gas. The purged pellicle is radiated by a radiation at a certain wavelength commonly used for lithography application, for example, 193 nm, or 157 nm. In another embodiment, a chamber is sealed with a pellicle membrane which divides the chamber into first and second compartments. The chamber has an inflow opening in the first compartment and an outflow opening in the second compartment. A gas is injected into the inflow opening and penetrates the pellicle membrane to the outflow opening. In another embodiment, the chamber has first inflow and outflow openings and second inflow and outflow openings in the first and second compartments, respectively. A first gas is injected into the first inflow opening and a second gas into the second inflow opening. The first and second gases have a permeability difference. The first gas penetrates the pellicle membrane to the second outflow opening.

In the following description, numerous specific details are set forth. However, it is understood that embodiments of the invention may be practiced without these specific details. In other instances, well-known circuits, structures, and techniques have not been shown in order not to obscure the understanding of this description.

One embodiment of the invention may be described as a process which is usually depicted as a flowchart, a flow diagram, a structure diagram, a sequence of operations, a sequence of fabrication phases, or a block diagram. Although a sequence of operations may describe the operations as a sequential process, many of the operations can be performed in parallel or concurrently. In addition, the order of the operations may be re-arranged. A process is terminated when its operations are completed. A process may correspond to a method, a program, a procedure, etc.

Figure 1:
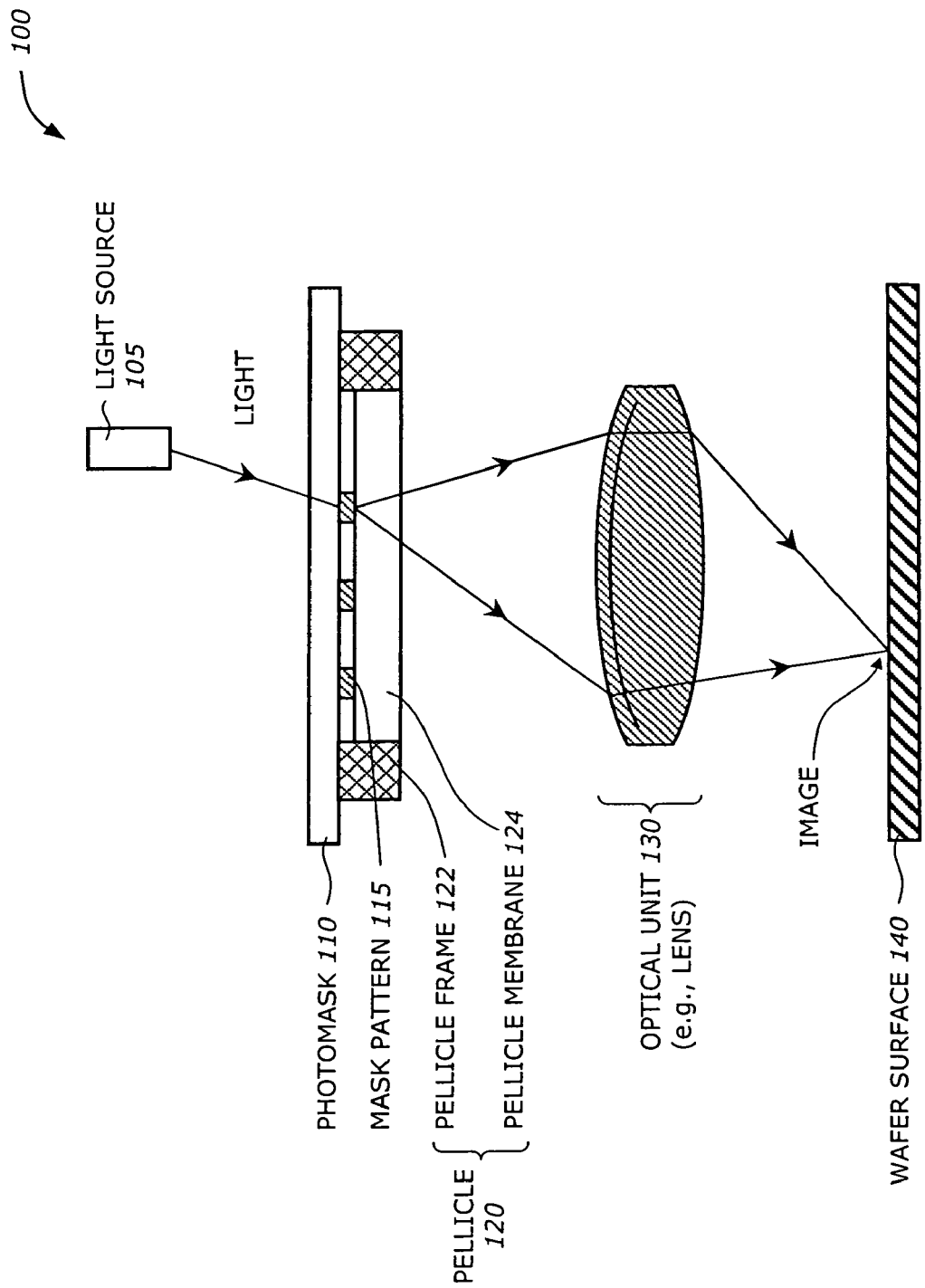
FIG. 1 is a diagram illustrating a system in which one embodiment of the invention can be practiced.

FIG. 1 is a diagram illustrating a system 100 in which one embodiment of the invention can be practiced. The system 100 includes a light source 105, a photomask 110, a mask pattern 115, a pellicle 120, an optical unit 130, and a wafer surface 140.

The light source 105 emits light to go through the mask pattern 115 of the photomask 110 and the optical unit 130 to create an image on the wafer surface 140. The light source 105 is a high intensity light source to provide appropriate wavelength. It may be a KrF laser, an ArF laser, a F2 laser, or a $Ar_2$ to provide respective wavelengths of 240 nm, 193 nm, 157 nm, and 126 nm. The photomask is a glass plate with an emulsion of metal film on one side patterned according to the mask pattern 115. The photomask is aligned with the wafer surface 240 so that the pattern of the mask pattern 115 can be transferred onto the wafer surface 140.

The pellicle 120 includes a thin membrane or plate and is placed between the photomask 110 and the optical unit 130 and the wafer surface 140. The pellicle 120 protects the photomask 110 from contamination without causing degradation in image quality. The pellicle can be placed below the mask, as shown in FIG. 1, above mask, or both. The invention provides techniques to improve stability, transmission characteristics, and radiation durability of the pellicle 120 by a combination of pre-baking and purging, and passive, active, and semi-active purging.

Figure 2:
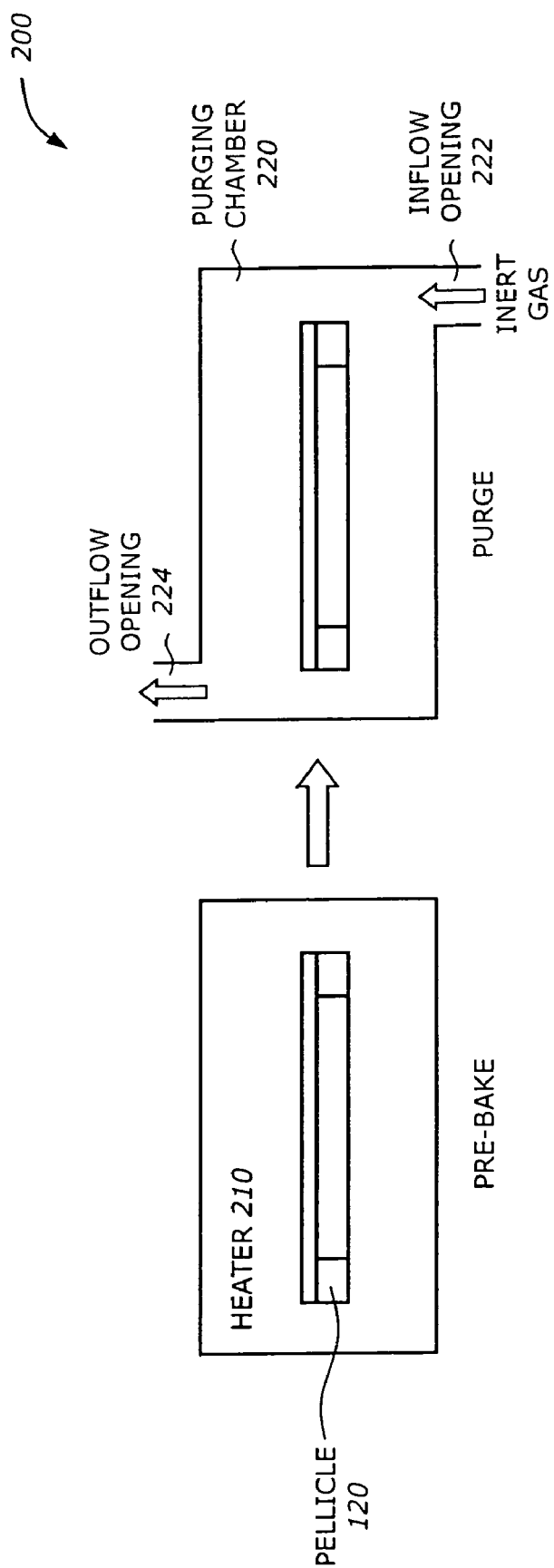
FIG. 2 is a diagram illustrating pre-baking and purging according to one embodiment of the invention.

FIG. 2 is a diagram illustrating a process 200 to pre-bake and purge according to one embodiment of the invention. The process 200 includes a heater 210 and a purging chamber 220.

The heater 210 is a device or unit to heat or bake the pellicle 120 before exposure. The heater 210 pre-bakes or pre-heats the pellicle 120 at a predetermined temperature over a pre-bake time interval. This predetermined temperature of heating is considerably lower than the glass transition temperature of the polymer to exclude film warping during the heat. At the temperatures below glass transition temperature Tg, the pellicle 120 is in the glassy state. Exceeding the Tg results in the conversion of the polymer in the rubbery state, and change polymer properties, such as coefficient of thermal expansion (CTE), modulus, and other mechanical properties. The change of CTE may result in the membrane warping and decreased modulus may result in loss of the membrane mechanical integrity. As such, pre-baking process is conducted at the temperatures below Tg. In an experiment, glass transition temperature was determined in a separate test of a Mitsui fluoropolymer-based pellicle for 193 nm. The glass transition temperature was determined as 103 degrees Celsius. The pre-bake temperature is chosen to be between 40 degrees Celsius to 50 degrees Celsius is considerably lower than glass transition temperature. Other pre-bake temperatures below Tg can be also used. For this temperature range, no warping was observed during heating.

The purging chamber 220 has an inflow opening 222 and an outflow opening 224. An inert gas in injected into the inflow opening 222 and flows out through the outflow opening. The purging can be done before or during irradiation. The purging can be any one of a passive set-up, an active set-up, and a semi-active set-up.

The combination of pre-baking and purging improves transmission response and radiation durability of the pellicle 120. In one embodiment, the pre-baking at the temperature range of 40 degrees Celsius to 50 degrees Celsius is performed for approximately 24 hours in a separate chamber in Nitrogen atmosphere.

Figure 3:
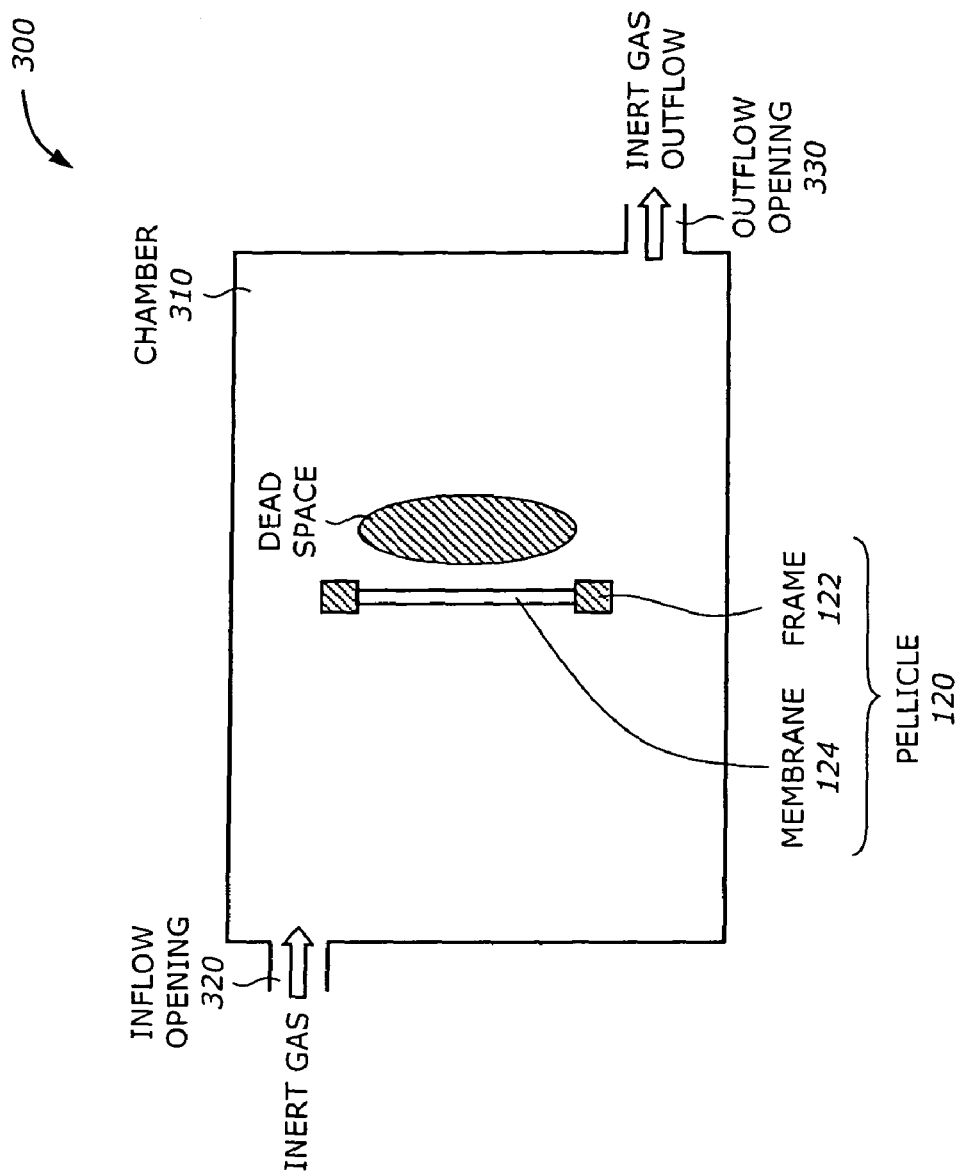
FIG. 3 is a diagram illustrating a passive purging set-up according to one embodiment of the invention.

FIG. 3 is a diagram illustrating a passive purging set-up 300 according to one embodiment of the invention. The passive set-up 300 includes a chamber 310 containing the pellicle 120. The pellicle 120 includes a pellicle frame 122 and a pellicle membrane 124, The chamber 310 is a housing that has an inflow opening 320 and an outflow opening 330. The pellicle 120 is mounted appropriately inside the chamber 310. An inert gas is injected into the inflow opening 320 and flows out of the chamber 310 through the outflow opening 330. The gas freely flows around the pellicle membrane 124.

The passive set-up 300 is simple, and easy to set up. However, the disadvantages includes low efficiency in removing impurities and dead space may be formed on the surface of the pellicle membrane 124 on the outlet side of the chamber toward the outflow opening 330.

Figure 4:
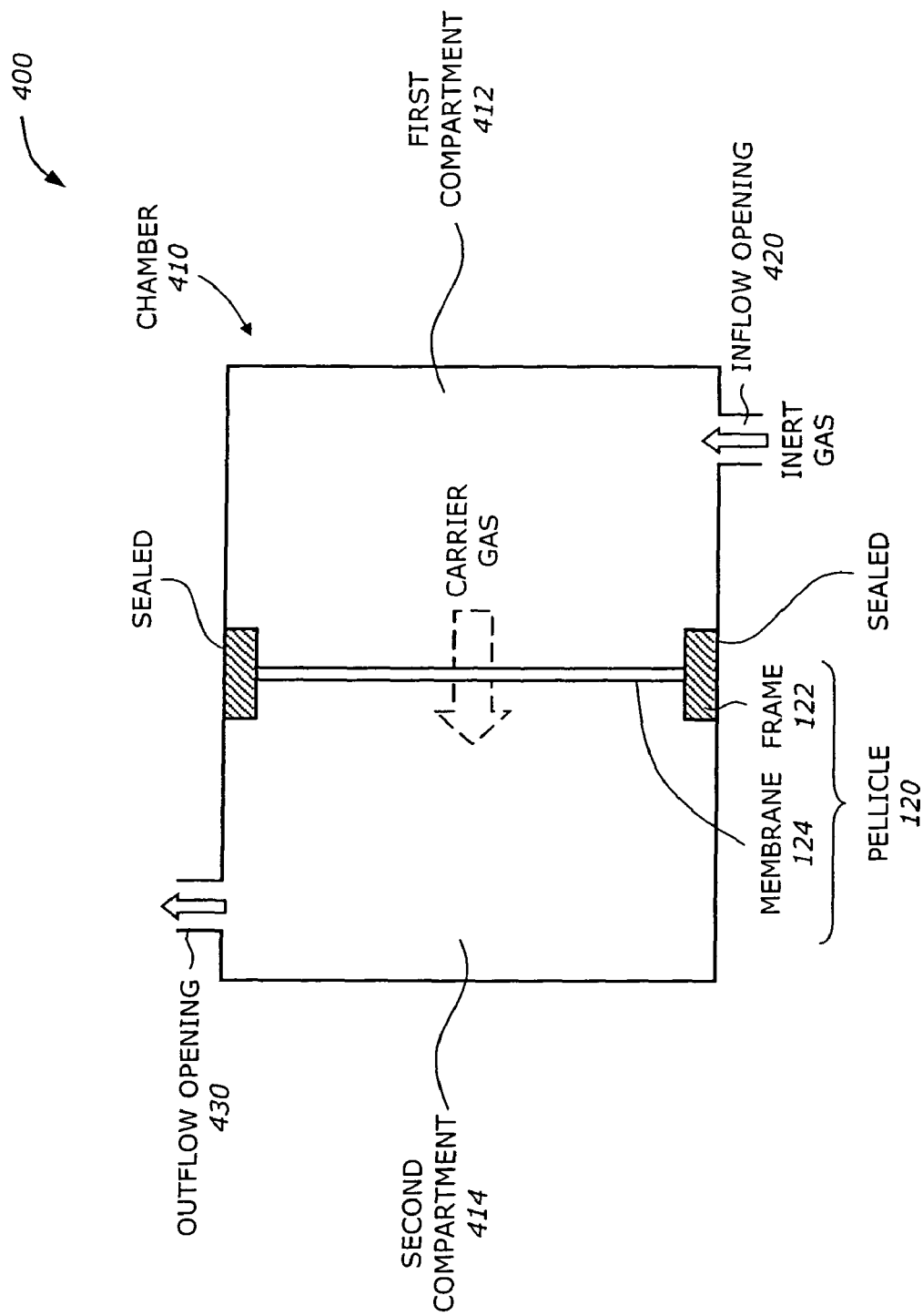
FIG. 4 is a diagram illustrating an active purging set-up according to one embodiment of the invention.

FIG. 4 is a diagram illustrating an active purging set-up 400 according to one embodiment of the invention. The active set-up 400 includes a chamber 410 containing the pellicle 120 with the pellicle frame 122 and membrane 124.

The chamber 410 has an inflow opening 420 and an outflow opening 430. The pellicle 120 is mounted inside the chamber 410 such that it effectively seals the chamber 410 and divides the chamber 410 into two compartments: a first compartment 412 having the inflow opening 420, and a second compartment 414 having the outflow opening 430. An inert gas is injected into the chamber 410 through the inflow opening 420. The gas penetrates through the pellicle membrane 124 and flows out of the chamber 410 through the outflow opening 430. Since the two compartments are effectively sealed in the inside of the chamber 410, the pressure is increased and built up. The gas flows through the membrane 124 with higher force than the passive set-up.

The advantages of the active set-up 400 include a high probability of removal of impurities due to the high pressure. Its disadvantages include a possibility of membrane rupture.

Figure 5:
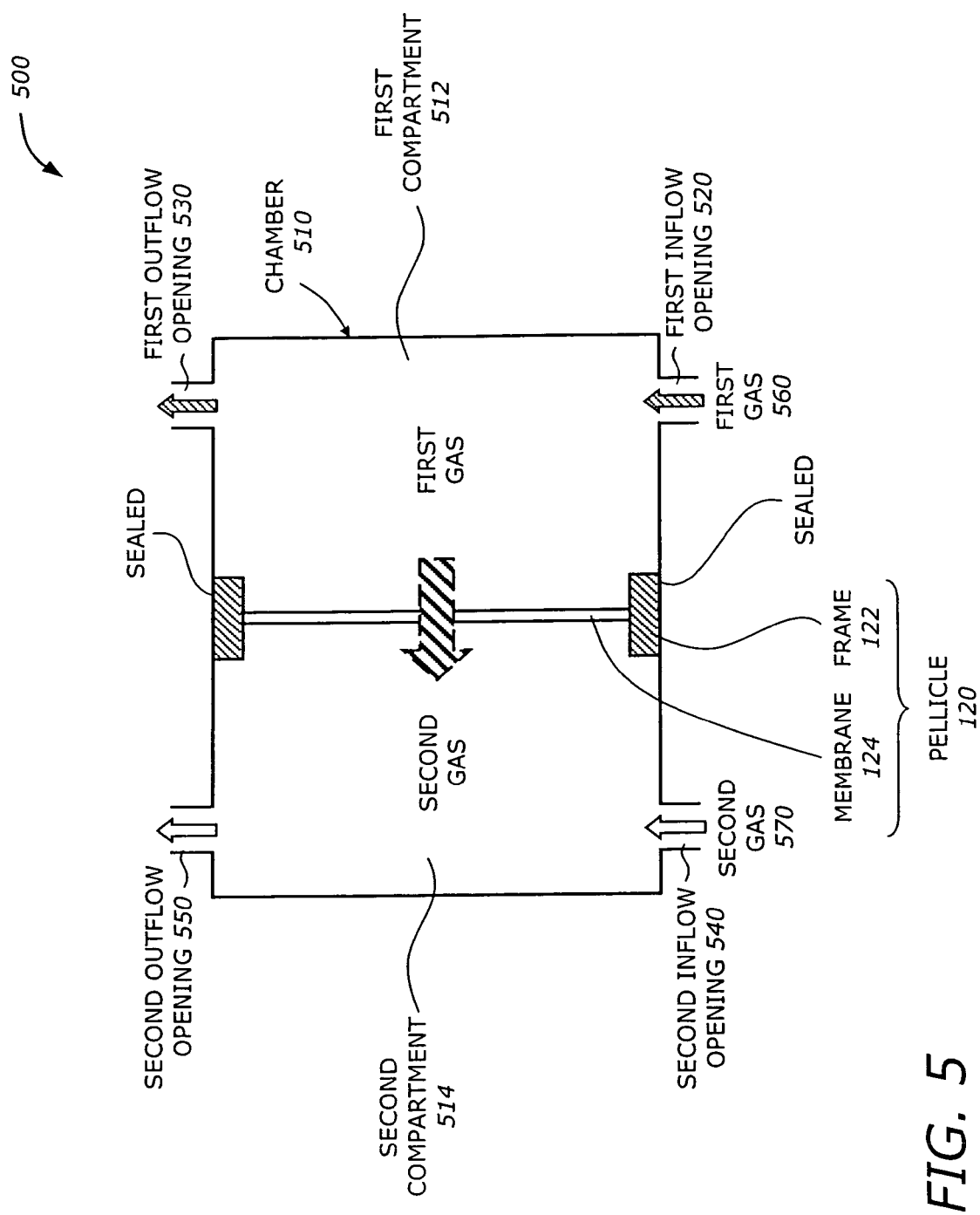
FIG. 5 is a diagram illustrating a semi-active purging set-up according to one embodiment of the invention.

FIG. 5 is a diagram illustrating a semi-active purging set-up 500 according to one embodiment of the invention. The semi-active set-up 500 includes a chamber 510 containing the pellicle 120 with the pellicle frame 122 and membrane 124.

The chamber 510 includes a first inflow opening 520, a first outflow opening 530, a second inflow opening 540, and a second outflow opening 550. The pellicle 120 is mounted inside the chamber 510 such that it effectively seals the chamber 510 and divides it into two compartments: a first compartment 512 having the first inflow and outflow openings 520 and 530, and a second compartment 514 having the second inflow and outflow openings 540 and 550.

A first gas 560 is injected into the first compartment 512 through the first inflow opening 520. A second gas 570 is injected into the second compartment 514 into the second inflow opening 540. The first gas 560 and the second gas 570 have a permeability difference. The first gas 560 has a higher permeability than the second gas 570. The permeability difference is typically high enough to cause penetration from the first gas to the second compartment. Part of the first gas 560 penetrates the membrane 124 and part flows out of the first compartment 512 through the first outflow opening 530. The second gas 570 gets mixed with the first gas 560 and flows out of the second compartment 514 through the second outflow opening 550.

The selection of the first gas 560 and the second gas 570 is based on their permeability as shown in Table 1 shows permeability of various gases through a typical fluoropolymer film. In one embodiment, the first gas is Oxygen, and the second gas is Nitrogen or a mixture of Nitrogen and Oxygen (e.g., 80% Nitrogen and 20% Oxygen).

TABLE 1

| Gas | Permeability ($cm^3 * cm/cm^2 * sec * Pa$) |
| --- | --- |
| Helium | $8.9 \times 10^{-12}$ |
| Oxygen | $4.2 \times 10^{-13}$ |
| Nitrogen | $1.0 \times 10^{-13}$ |
| Water vapor | $1.1 \times 10^{-12}$ |

The use of Oxygen as the first gas 560 is beneficial because Oxygen has free radical stabilizing properties which can prolong the lifetime of the pellicle membrane 124 by reacting with free radical side products of the 157 nm irradiation. This free radical stabilizing effect is beneficial even if the semi-active purge is only implemented prior to irradiation, in between reticle loads. Although semi-active purge during exposure may be difficult due to current stepper configurations, it is anticipated that modifications of stepper design or configurations may allow it.

The advantages of the semi-active set up 500 include lesser risk of membrane rupture. Its disadvantages include more complex set-up configuration which may be difficult during radiation exposure.

Figure 6:
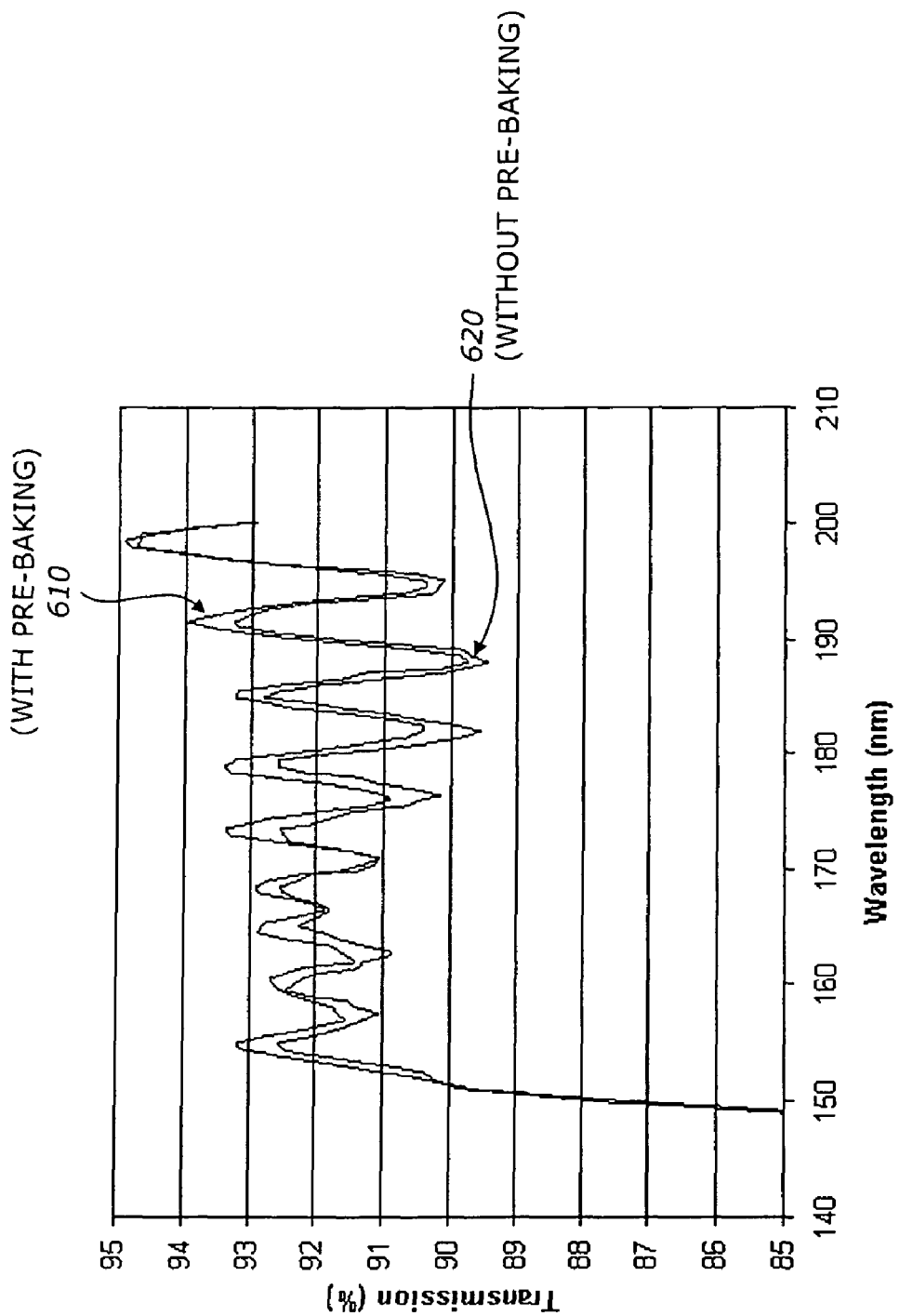
FIG. 6 is a diagram illustrating transmission spectra of 157 nm pellicle before and after pre-baking according to one embodiment of the invention.

FIG. 6 is a diagram illustrating transmission spectra of 157 nm pellicle before and after pre-baking according to one embodiment of the invention.

The transmission spectra for 157 nm wavelength shown in FIG. 6 show results of pre-baking. There are two spectra: a curve 610 is with pre-baking and a curve 620 is without pre-baking. Passive purging is performed as shown in FIG. 2. The pellicle is heated for 24 hours at approximately 40 degrees Celsius in Nitrogen environment. At 157 nm wavelength, the transmission was improved by approximately 2%.

Figure 7:
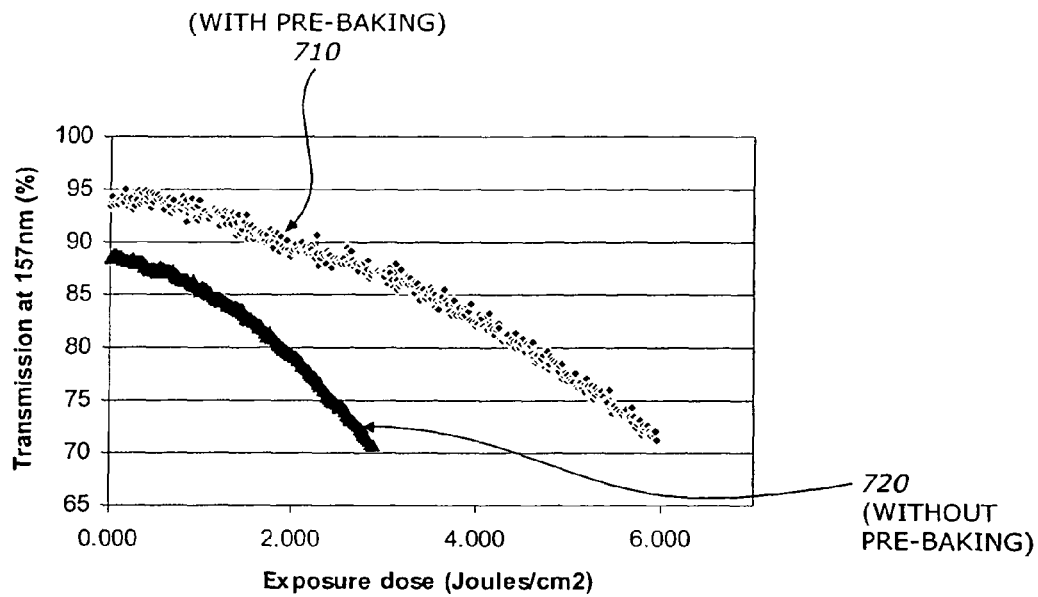
FIG. 7 is a diagram illustrating radiation durability with and without pre-baking according to one embodiment of the invention.

FIG. 7 is a diagram illustrating radiation durability with and without pre-baking according to one embodiment of the invention.

The transmission spectra shown in FIG. 7 show result of pre-baking for the 157 nm wavelength. There are two spectra: a curve 710 is with pre-baking and a curve 729 is without pre-baking. Passive purging is performed in pure Nitrogen. The pellicle is pre-baked at approximately 40 degrees Celsius.

As shown in FIG. 7, purging with pre-baking provides approximately two times higher longevity than purging without pre-baking. The curve 710 shows that the transmission drops from 95% to 70% at exposure dose of 6 J×s/cm² while the curve 720 shows a much faster drop from 90% to 70% at exposure dose of only 3 J×s/cm².

Figure 8:
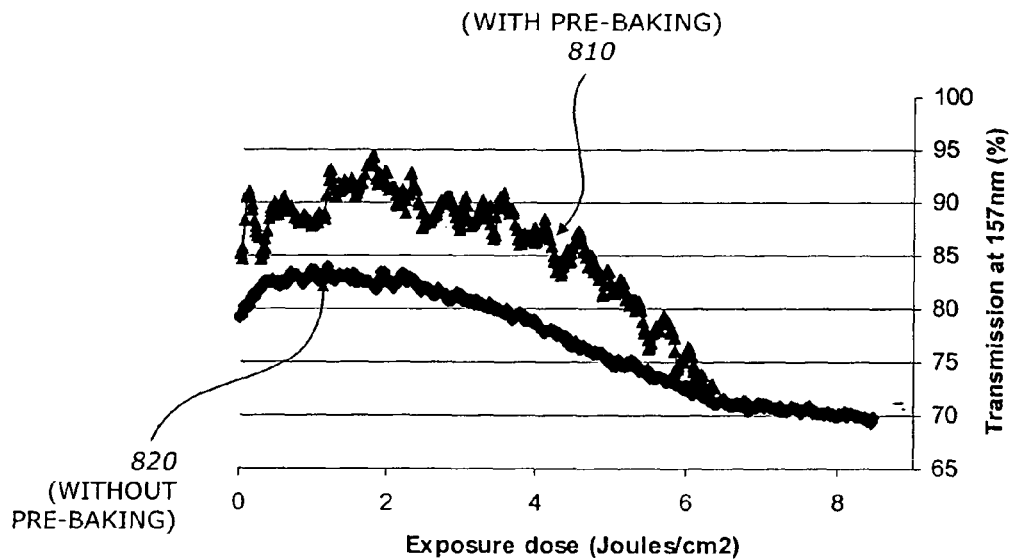
FIG. 8 is a diagram illustrating radiation durability with and without pre-baking for mixed gases according to one embodiment of the invention.

FIG. 8 is a diagram illustrating radiation durability with and without pre-baking for mixed gases according to one embodiment of the invention.

The transmission spectra shown in FIG. 8 show result of pre-baking for the 157 nm wavelength. There are two spectra: a curve 810 is with pre-baking and a curve 820 is without pre-baking. Passive purging is performed in a mix of Nitrogen and 1000 ppm Oxygen. The pellicle is pre-baked at approximately 40 degrees Celsius.

As shown in FIG. 8, purging with pre-baking provides higher longevity than purging without pre-baking.

Figure 9:
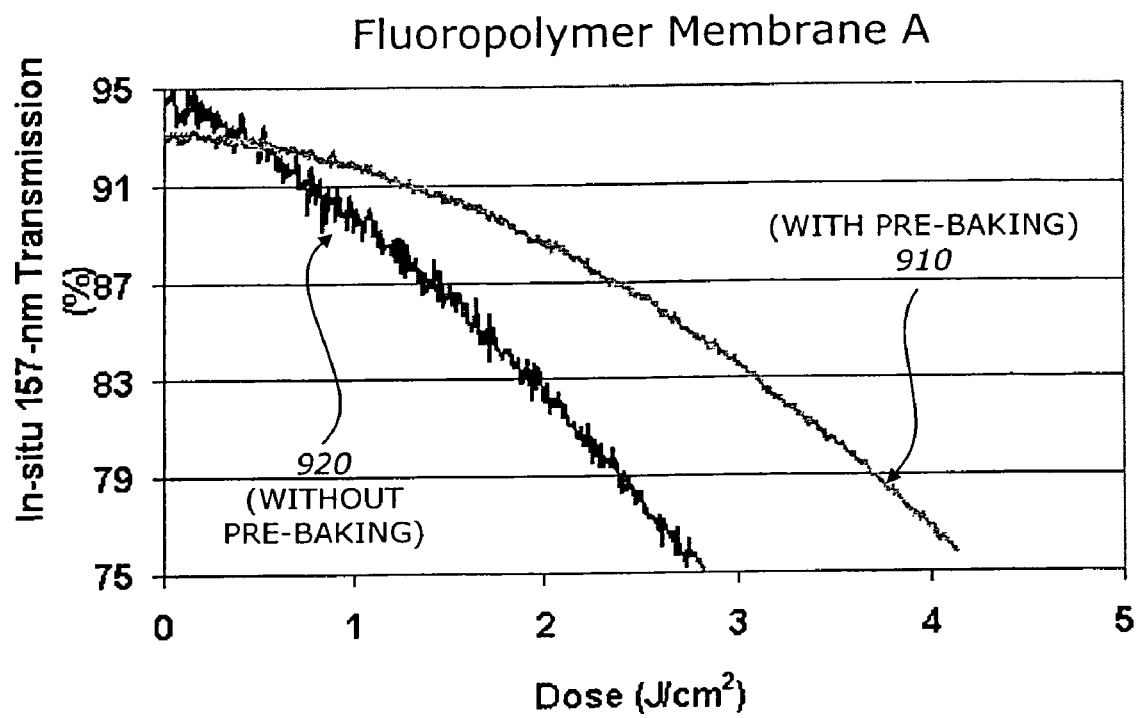
FIG. 9 is a diagram illustrating transmission spectra for nitrogen with and without pre-baking according to one embodiment of the invention.

FIG. 9 is a diagram illustrating transmission spectra for nitrogen with and without pre-baking according to one embodiment of the invention.

The transmission spectra shown in FIG. 9 show result of pre-baking for the 157 nm wavelength with another set of samples. There are two spectra: a curve 910 is with pre-baking and a curve 920 is without pre-baking. Passive purging is performed in a low Oxygen environment. The pellicle is pre-baked at approximately 40 degrees Celsius.

As shown in FIG. 9, the curve 910 exhibits about 30% longer lifetime than the curve 920. At 75% transmission, the curve 910 is at 4.1 J/cm² while the curve 920 is at about 2.9 J/cm².

Figure 10:
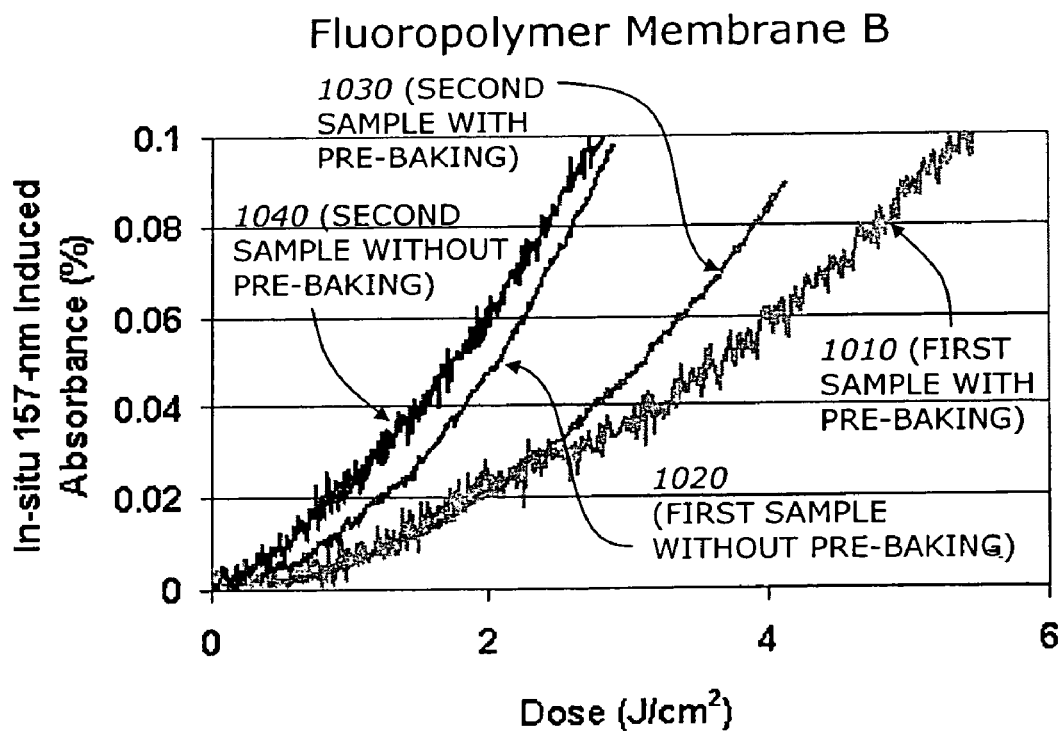
FIG. 10 is a diagram illustrating induced absorbance with and without pre-baking according to one embodiment of the invention.

FIG. 10 is a diagram illustrating induced absorbance with and without pre-baking according to one embodiment of the invention.

The transmission spectra shown in FIG. 10 show result of pre-baking for the 157 nm wavelength with another set of samples. There are four spectra corresponding to two sets of samples. For the first set, a curve 1010 is with pre-baking and a curve 1020 is without pre-baking. For the second set, a curve 1030 is with pre-baking and a curve 1040 is without pre-baking. Passive purging is performed in a low Oxygen environment. The pellicle is pre-baked at approximately 40 degrees Celsius.

As shown in FIG. 10, the curves 1010 and 1030 reach 0.06 induced absorbance at the exposure level up to two times that of the corresponding curves 1020 and 1040 (e.g., 2.6 J/cm² and 4 J/cm² vs. 1.9 J/cm² and 2 J/cm², respectively).

Figure 11:
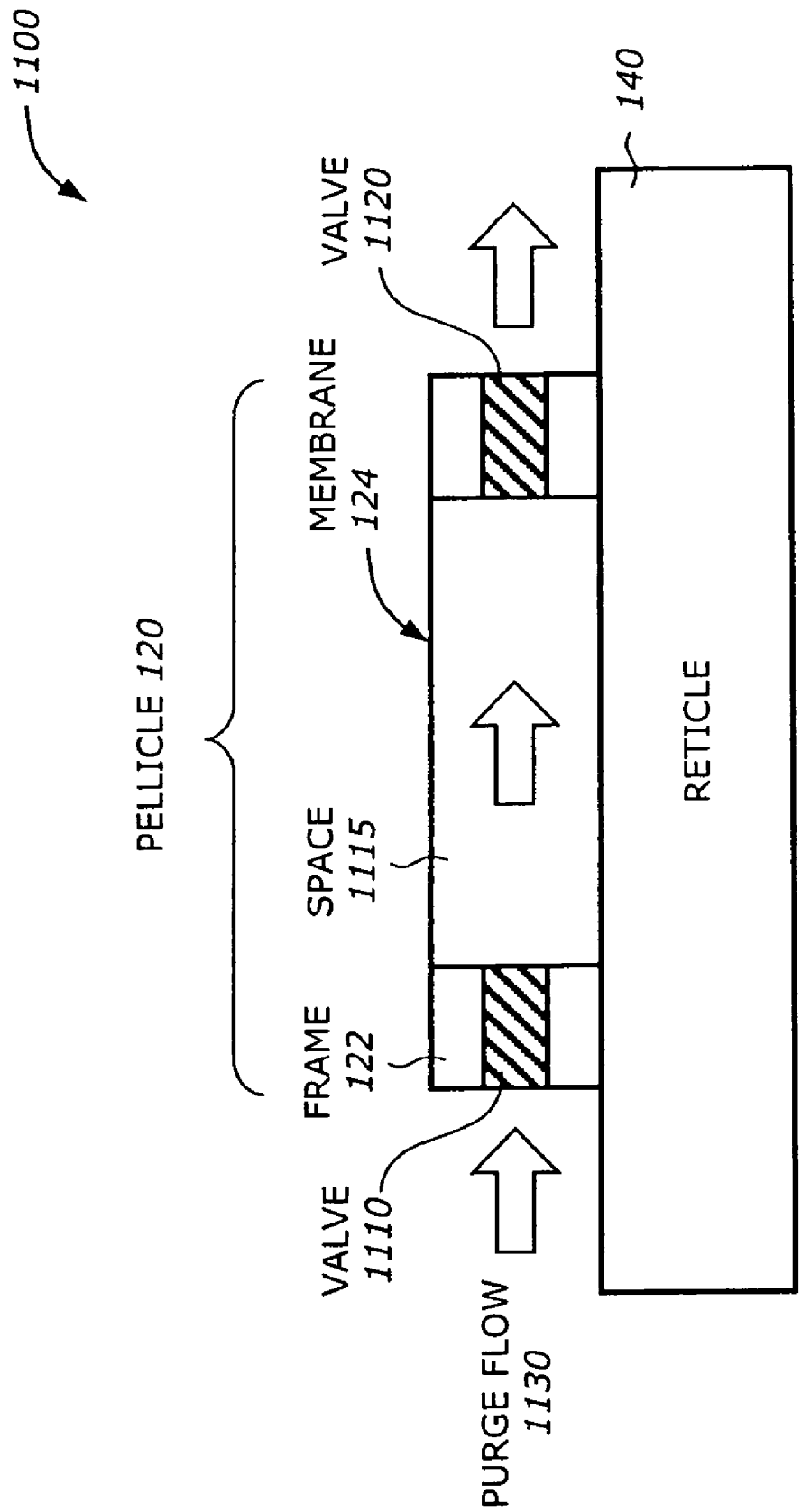
FIG. 11 is a diagram illustrating purging using a pellicalized reticle according to one embodiment of the invention.

FIG. 11 is a diagram illustrating a pellicalized reticle 1100 according to one embodiment of the invention. The pellicalize reticle 1100 includes the pellicle 120 and a reticle 1140.

The pellicle 120 includes the pellicle frame 122 and the pellicle membrane 124. The pellicle frame 122 and the membrane 124 form a pellicle space 1115. The pellicle frame 122 includes an inflow valve 1110 and an outflow valve 1120 at the two ends. These valves are firmly secured at the two ends to allow a purge flow 1130 to go through the pellicle space 1115. In one embodiment, each of the valves 1110 and 1120 is a pressure release valve that can be activated to provide pressurizing mechanism to allow the purge flow to remove any outgassing contaminants and therefore reduce the incidence of formation of new defects at 193 nm and 157 nm.

The reticle 1140 is attached to the pellicle 120 to provide means for support and transport. The pellicalized reticle 1100 is used to reduce defects formed under the pellicle used in high volume manufacturing environment. These defects may be attributed to materials outgassing (e.g., pellicle adhesives, reticle storage cases) and through photoreaction of outgassing compounds upon exposure. The purging can be performed at any stage during the lifetime of the pellicalized reticle 1100.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   pre-baking a pellicle having a pellicle membrane at a pre-determined temperature substantially below a glass transition temperature of the pellicle membrane;
   purging the pre-baked pellicle with an inert gas in a purging chamber having an inflow opening and an outflow opening, purging comprising injecting the inert gas into the inflow opening so that the inert gas flows around or penetrates the pellicle membrane, the inert gas flowing out of the purging chamber through the outflow opening; and
   radiating the purged pellicle by a radiation at a wavelength.

2. The method of claim 1 wherein pre-baking comprises:
   pre-baking the pellicle at the pre-determined temperature of between 40 degrees Celsius to 50 degrees Celsius.

3. The method of claim 1 wherein purging comprises:
   purging the pre-baked pellicle with one of an inert nitrogen and a mix of nitrogen and oxygen.

4. The method of claim 1 wherein radiating comprises:
   radiating the purged pellicle at the wavelength of approximately 157 nm or 193 nm.

5. An apparatus comprising:
   a pellicle having a pellicle membrane being pre-baked at a predetermined temperature substantially below a glass transition temperature of the pellicle membrane; and
   a chamber containing the pre-baked pellicle to purge the pre-baked pellicle with an inert gas, the chamber having an inflow opening and an outflow opening, the inert gas being injected through the inflow opening to flow around or penetrate the pellicle membrane, the inert gas flowing out of the purging chamber through the outflow opening, the purged pellicle being radiated by a radiation at a wavelength.

6. The apparatus of claim 5 wherein the pellicle is pre-baked at the pre-determined temperature of between 40 degrees Celsius to 50 degrees Celsius.

7. The apparatus of claim 5 wherein the pre-baked pellicle is purged with one of an inert nitrogen and a mix of nitrogen and oxygen.

8. The apparatus of claim 5 wherein the wavelength is approximately 157 nm or 193 nm.

9. An apparatus comprising:
   a chamber sealed with a pellicle membrane, the pellicle membrane dividing the chamber into first and second compartments, the chamber having an inflow opening in the first compartment and an outflow opening in the second compartment, the inflow opening receiving a gas, the gas penetrating the pellicle membrane to the outflow opening.

10. The apparatus of claim 9 wherein the gas is injected before or during radiation by a radiation at a wavelength.

11. The apparatus of claim 9 wherein the gas is one of a nitrogen gas and a mixture of nitrogen and oxygen.

12. An apparatus comprising:
    a chamber being sealed with a pellicle membrane, the pellicle membrane dividing the chamber into first and second compartments, the chamber having a first inflow opening and a first outflow opening in the first compartment and a second inflow opening and a second outflow opening in the second compartment, the first and second inflow openings receiving first and second gases, the first and second gases having a permeability difference, the first gas penetrating the pellicle membrane to the second outflow opening.

13. The apparatus of claim 12 wherein the first gas and the second gas are injected before or during radiation by a radiation at a wavelength.

14. The apparatus of claim 12 wherein the first gas is oxygen and the second gas is one of nitrogen and mixture of nitrogen and oxygen.

15. A system comprising:
    a photomask having a mask pattern to receive a light from a light source;
    an optical unit to project an image of the mask pattern on a wafer surface using the light; and
    a pellicle unit coupled to the photomask to protect the photomask, the pellicle unit comprising:
        a pellicle having a pellicle membrane being pre-baked at a predetermined temperature substantially below a glass transition temperature of the pellicle membrane; and
        a chamber containing the pre-baked pellicle to purge the pellicle with an inert gas, the chamber having an inflow opening and an outflow opening, the inert gas being injected through the inflow opening to flow around or penetrate the pellicle membrane, the inert gas flowing out of the purging chamber through the outflow opening, the purged pellicle being radiated by a radiation at a wavelength.

16. The system of claim 15 wherein the pellicle is pre-baked at the pre-determined temperature of between 40 degrees Celsius to 50 degrees Celsius.

17. The system of claim 15 wherein the pre-baked pellicle is purged with one of an inert nitrogen and a mix of nitrogen and oxygen.

18. The system of claim 15 wherein the wavelength is approximately 157 nm or 193 nm.

* * * * *